United States Patent
Zhu et al.

(10) Patent No.: US 7,826,258 B2
(45) Date of Patent: Nov. 2, 2010

(54) CROSSBAR DIODE-SWITCHED MAGNETORESISTIVE RANDOM ACCESS MEMORY SYSTEM

(75) Inventors: Jian-Gang Zhu, Pittsburgh, PA (US); Yi Luo, Pittsburgh, PA (US); Xin Li, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 302 days.

(21) Appl. No.: 12/079,036

(22) Filed: Mar. 24, 2008

(65) Prior Publication Data

US 2009/0237987 A1 Sep. 24, 2009

(51) Int. Cl.
G11C 11/14 (2006.01)

(52) U.S. Cl. .................. 365/171; 365/173; 365/158; 365/55; 365/130

(58) Field of Classification Search ............ 365/171, 365/173, 158, 55, 130
See application file for complete search history.

(56) References Cited

U.S. PATENT DOCUMENTS

| | | | |
|---|---|---|---|
| 5,965,285 A * | 10/1999 | Mihara et al. | 428/820.1 |
| 6,391,483 B1 | 5/2002 | Zhu et al. | |
| 6,432,563 B1 * | 8/2002 | Zou et al. | 428/826 |
| 6,498,747 B1 | 12/2002 | Gogl et al. | |
| 6,638,774 B2 * | 10/2003 | Raberg | 438/3 |
| 6,791,871 B2 | 9/2004 | Freitag et al. | |
| 6,794,695 B2 * | 9/2004 | Sharma et al. | 257/295 |
| 6,834,026 B2 | 12/2004 | Fullerton et al. | |
| 6,956,257 B2 | 10/2005 | Zhu et al. | |
| 7,020,009 B2 * | 3/2006 | Ho et al. | 365/158 |
| 7,119,410 B2 * | 10/2006 | Saito et al. | 257/422 |
| 7,190,558 B2 * | 3/2007 | Iwasaki et al. | 360/324.11 |
| 7,301,733 B1 * | 11/2007 | Fukuzawa et al. | 360/324.1 |
| 7,310,265 B2 * | 12/2007 | Zheng et al. | 365/158 |
| 7,313,043 B2 | 12/2007 | Gogl et al. | |
| 7,394,684 B2 * | 7/2008 | Inokuchi et al. | 365/158 |
| 7,485,938 B2 * | 2/2009 | Saito et al. | 257/422 |
| 2004/0094785 A1 | 5/2004 | Zhu et al. | |
| 2005/0281081 A1 | 12/2005 | Fullerton et al. | |
| 2006/0108619 A1 * | 5/2006 | Yoshida et al. | 257/295 |
| 2008/0180827 A1 * | 7/2008 | Zhu et al. | 360/59 |

OTHER PUBLICATIONS

Zhu et al., "Spin Torque and Field-Driven Perpendicular MRAM Designs Scalable to Multi-Gb/Chip Capacity," IEEE Trans. on Magnetics, vol. 42, No. 10, Oct. 2006, pp. 2739-2741.

Ditizio et al., "Cell Shape and Patterning Considerations for Magnetic Random Access Memory (MRAM) Fabrication," Semiconductor Manufacturing Magazine, Jan. 2004.

"Binary Anisotropy Media," Annual International Conference on Magnetism and Magnetic Materials, Nov. 5-8, 2007, Tampa, FL, U.S.A.

* cited by examiner

*Primary Examiner*—Viet Q Nguyen
(74) *Attorney, Agent, or Firm*—K & L Gates LLP

(57) ABSTRACT

A magnetic memory or MRAM memory system comprising an M×N crossbar array of MRAM cells. Each memory cell stores binary data bits with switchable magnetoresistive tunnel junctions (MJT) where the electrical conductance changes as the magnetic moment of one electrode (the storage layer) in the MJT switches direction. The switching of the magnetic moment is assisted by a phase transition interlayer that transitions from antiferromagnetic to ferromagnetic at a well defined, above ambient temperature.

38 Claims, 10 Drawing Sheets

CROSSBAR DIODE-SWITCHED MAGNETORESISTIVE RANDOM ACCESS MEMORY SYSTEM

BACKGROUND

Magnetoresistive random access memory (MRAM) is a non-volatile computer memory type that stores data with magnetic storage elements. The magnetic storage elements (or cells) usually are formed from two ferromagnetic plates, each of which can hold a magnetic field, separated by a thin insulating layer. One of the two plates is a permanent magnet set to a particular polarity. The other plate's field changes to match that of an external field.

A magnetic memory device typically comprises an array of such memory cells, each cell being individually addressable by a particular word line and bit line arranged at right angles, above and below the cell, respectively. When current is passed through them, an induced magnetic field is created at the junction, which the writable plate picks up, in order to write data to the memory cell. It should be noted that as magnetic memory cells are scaled down in size, there comes a time when the induced field used to write data to a particular cell overlaps adjacent cells over a small area, leading to potential false writes.

Reading of the memory cells is accomplished by measuring the electrical resistance of the cell. A particular cell typically is selected by powering an associated transistor, which switches current from a supply line through the cell to ground. Due to the magnetic tunnel effect, the electrical resistance of the cell changes due to the orientation of the fields in the two plates. By measuring the resulting current, the resistance inside any particular cell can be determined, and from this the polarity of the writable plate.

It is known to use bilayer in MRAM storage elements that comprises (i) a magnetically hard layer and (ii) a switching material, like FeRh, that exhibits a transition from antiferromagnetic to ferromagnetic at a transition temperature less than the Curie temperature of the magnetically hard layer to assist in the control of switching the memory cell. Published U.S. patent application Pub. No. 2005/0281081 A1 describes one such memory cell.

SUMMARY

The present invention is directed to an MRAM memory system comprising an M×N crossbar array of MRAM cells. Each memory cell stores binary data bits with switchable magnetoresistive tunnel junctions (MJT) where the electrical conductance changes as the magnetic moment of one electrode (the storage layer) in the MJT switches direction. The switching of the magnetic moment is assisted by a phase transition interlayer that transitions from antiferromagnetic to ferromagnetic at a well defined, above ambient temperature. Further, each memory cell comprises a two-terminal diode, which prevents unwanted parasitic current loops during write and read operations. Further, the use of a vertically diode dramatically reduces the complexity and the number of steps involved in fabricating the MRAM system. It also allows the memory cells to be packed more densely than conventional RAM. The two-terminal diode may be, for example, a semiconductor p-n junction diode, a Schottky diode, or a metal-insulator-metal diode.

The MRAM system, according to various embodiments, combines major advantages of several popular memory technologies. First, like flash memory, it is truly non-volatile. Second, the memory cells 10 have higher speeds than flash memory. In fact, the memory cells of the present invention can be made even faster than DRAM, and close to SRAM. Third, unlike phase-change memory (PRAM), which has lifetime issues, the MRAM cells of the present invention can have basically unlimited write-erase life cycles. Forth, the crossbar circuit approach offers extremely high device density, much higher than the emerging ZRAM (1T DRAM). Finally, because an MRAM cell can retain its memory without the need of refreshing, the MRAM system of the present invention should consume less power than volatile memories. These and other advantages of the present invention will be apparent from the description to follow.

FIGURES

Various embodiments of the present invention are described herein by way of example in conjunction with the following figures, wherein.

Figure 4:
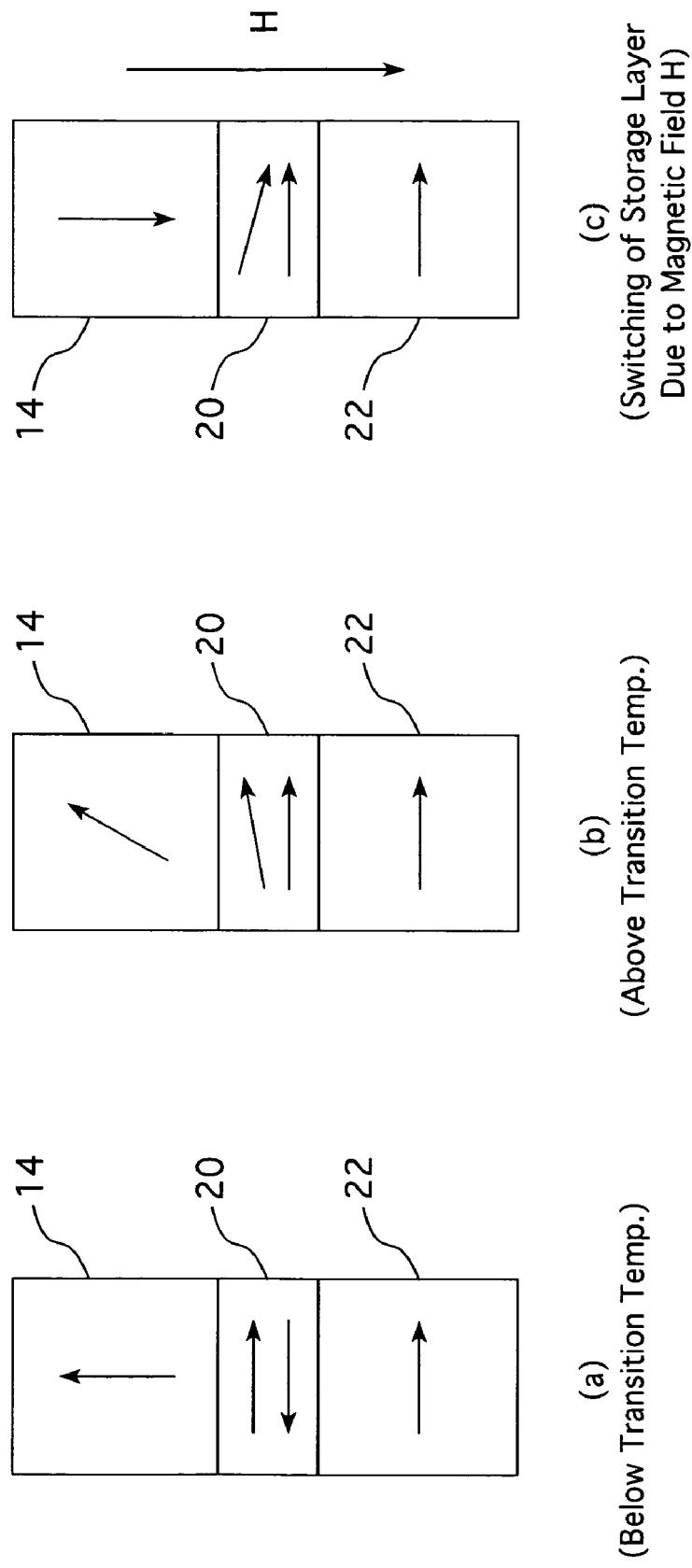
Figure 5:
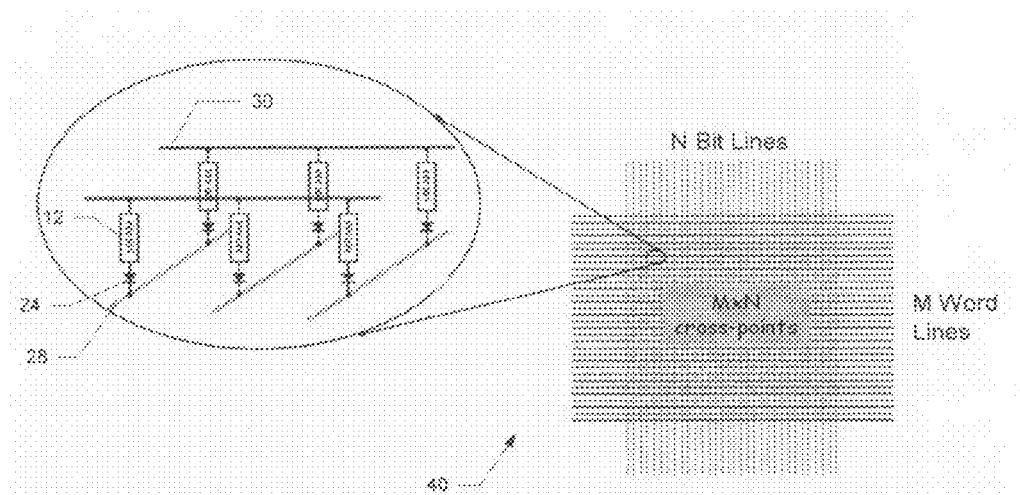
Figures 6A, 6B:
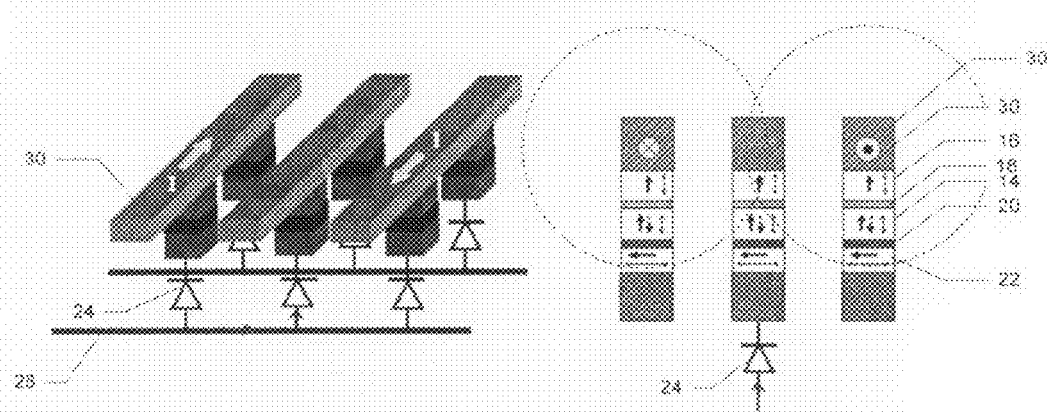
Figure 8A:
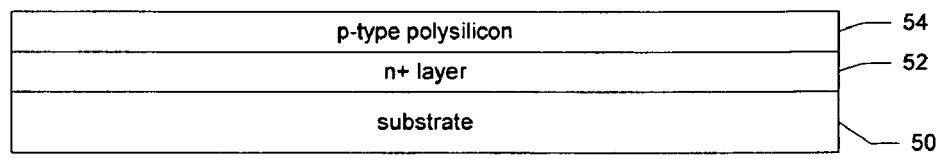
Figure 8B:
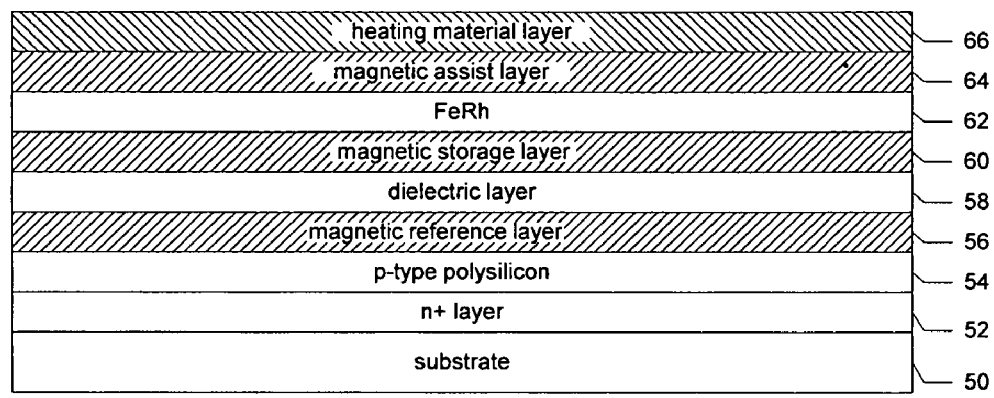
Figure 8C:
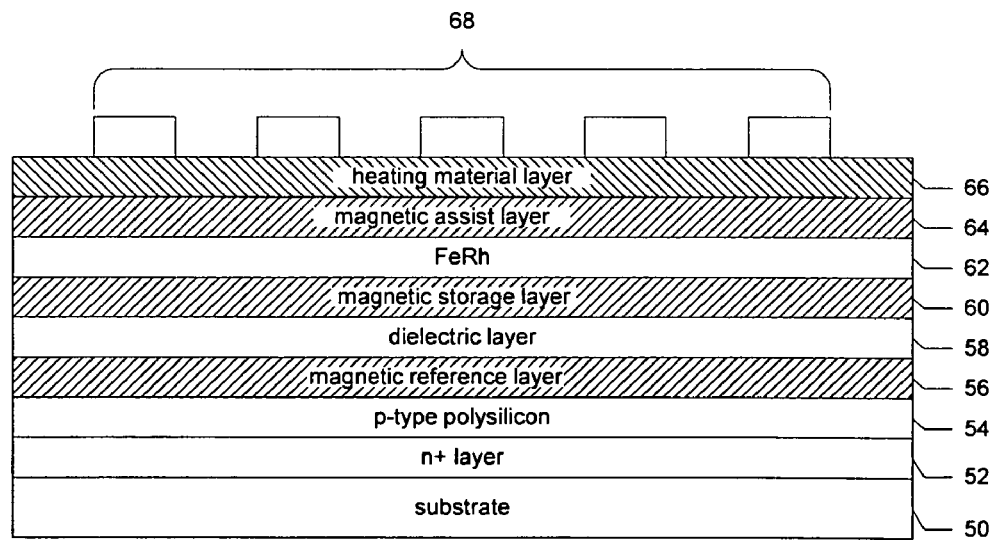
Figure 8D:
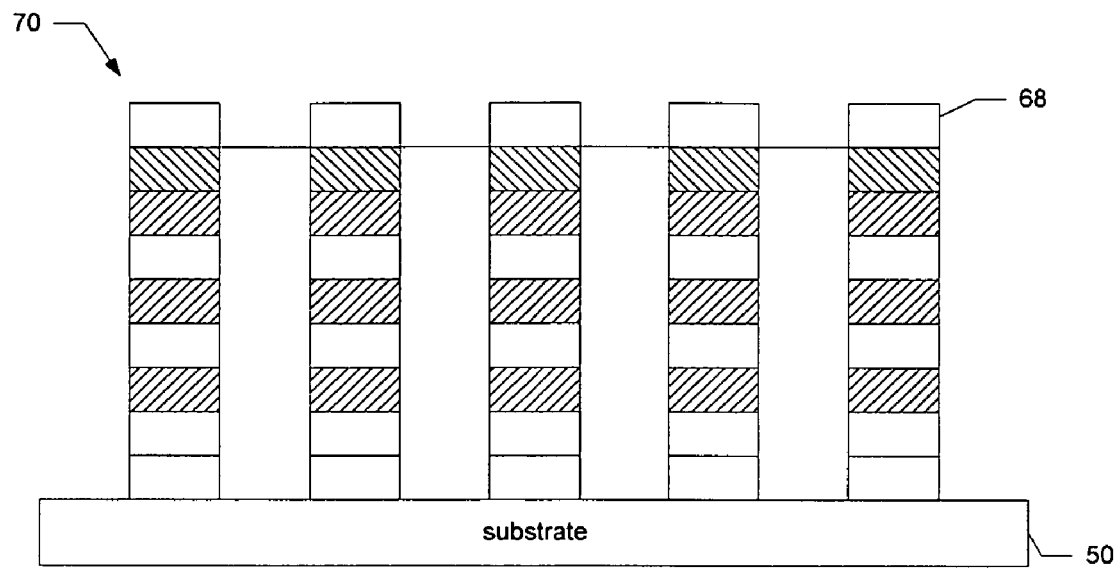
Figure 8E:
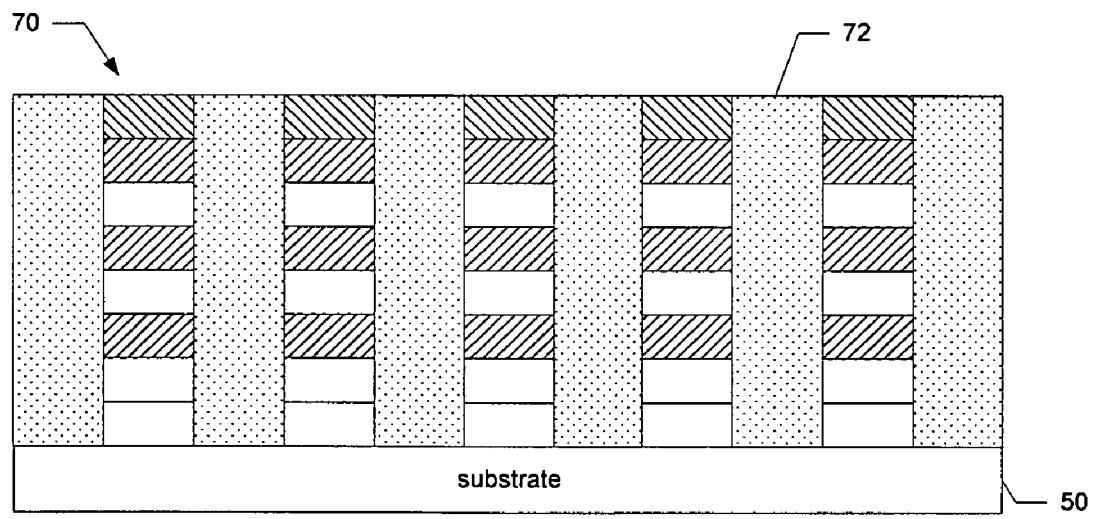
Figure 8F:
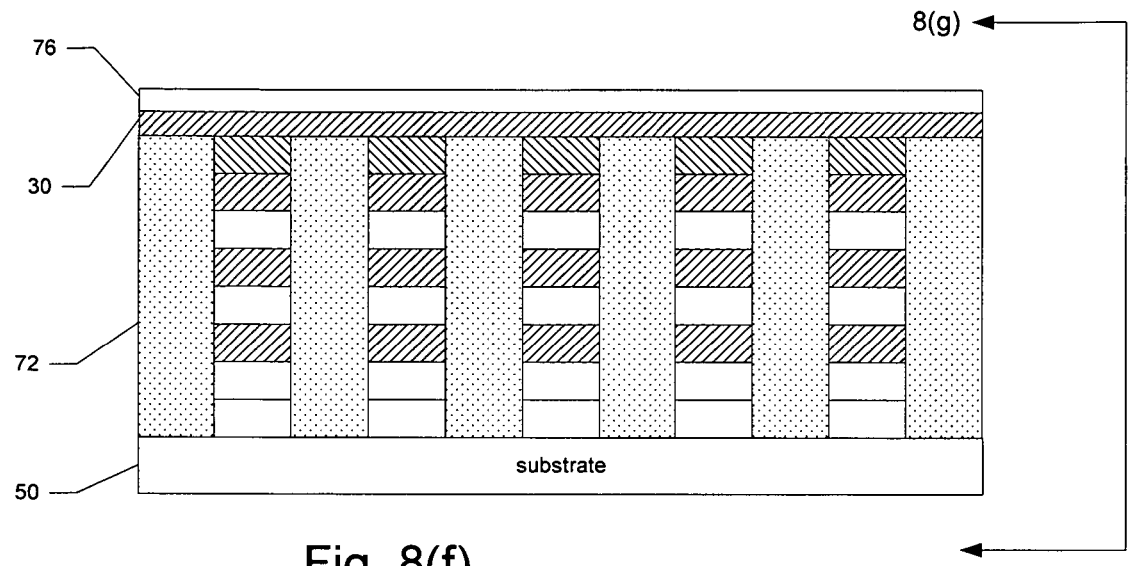
Figure 8G:
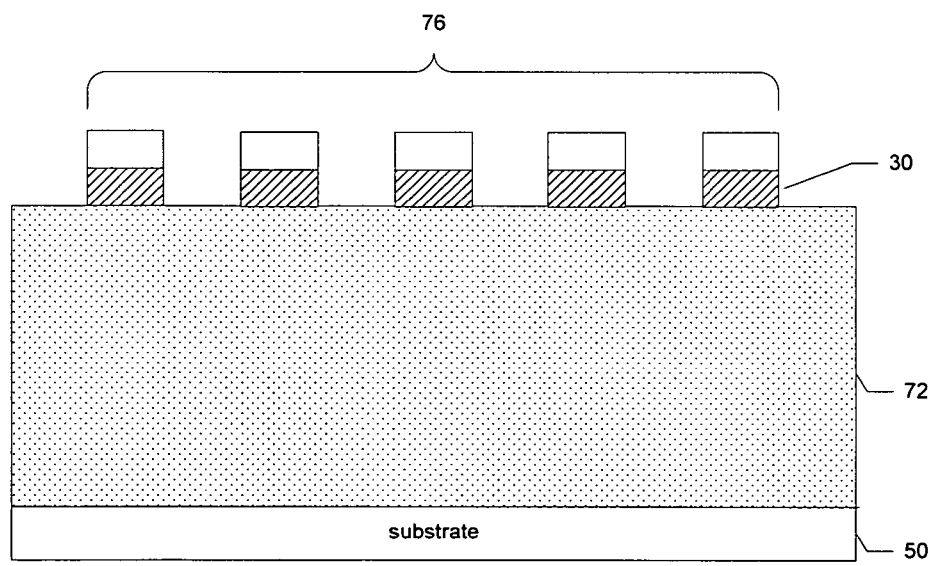
Figure 8H:
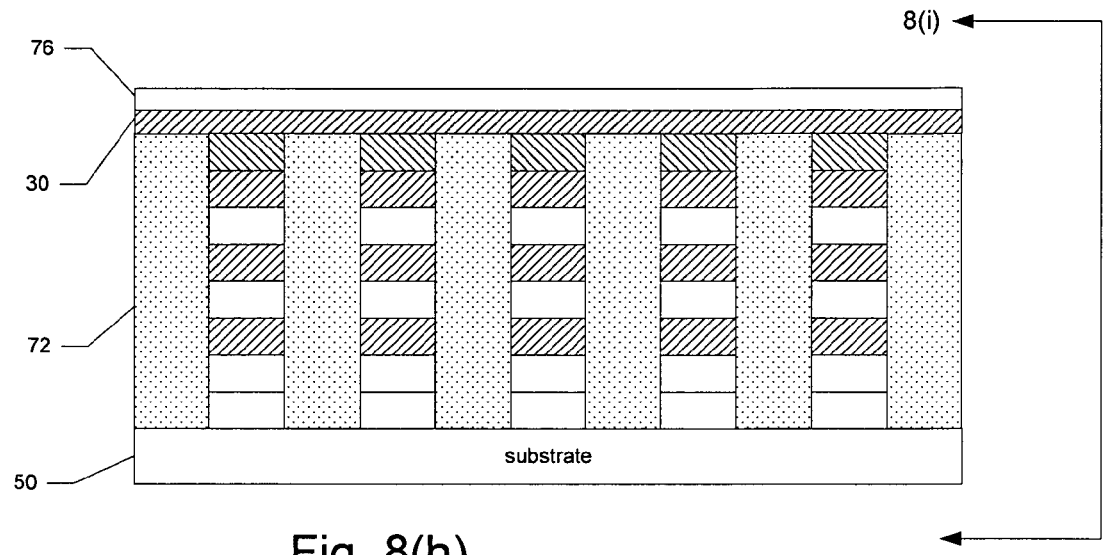
Figure 8I:
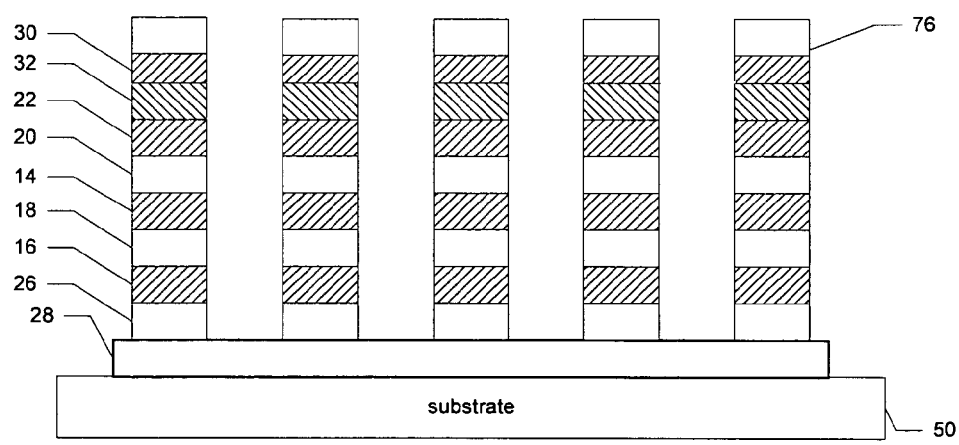
Figure 8J:
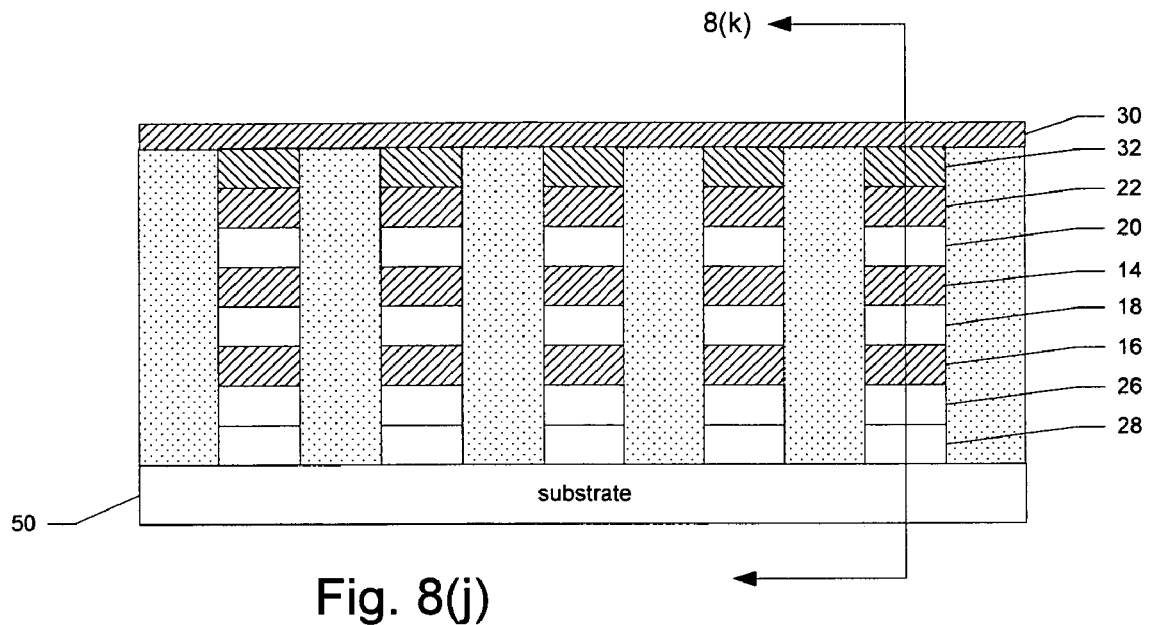
Figure 8K:
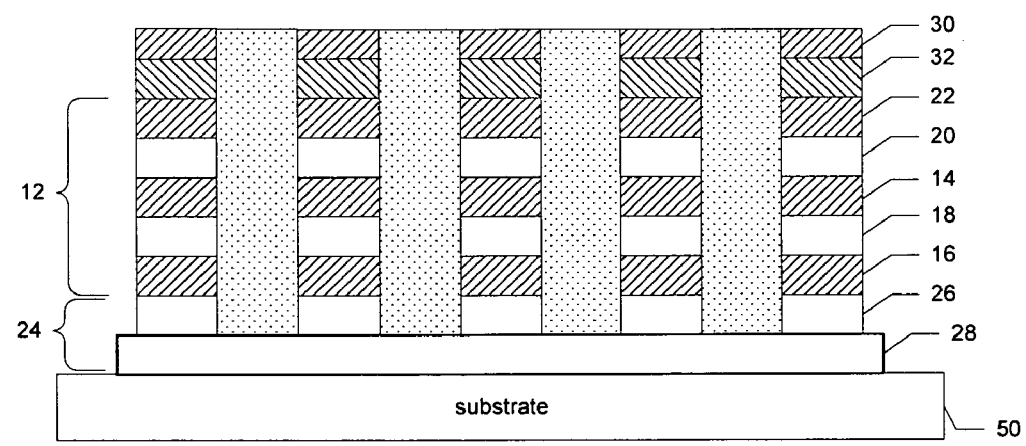
Figure 9:
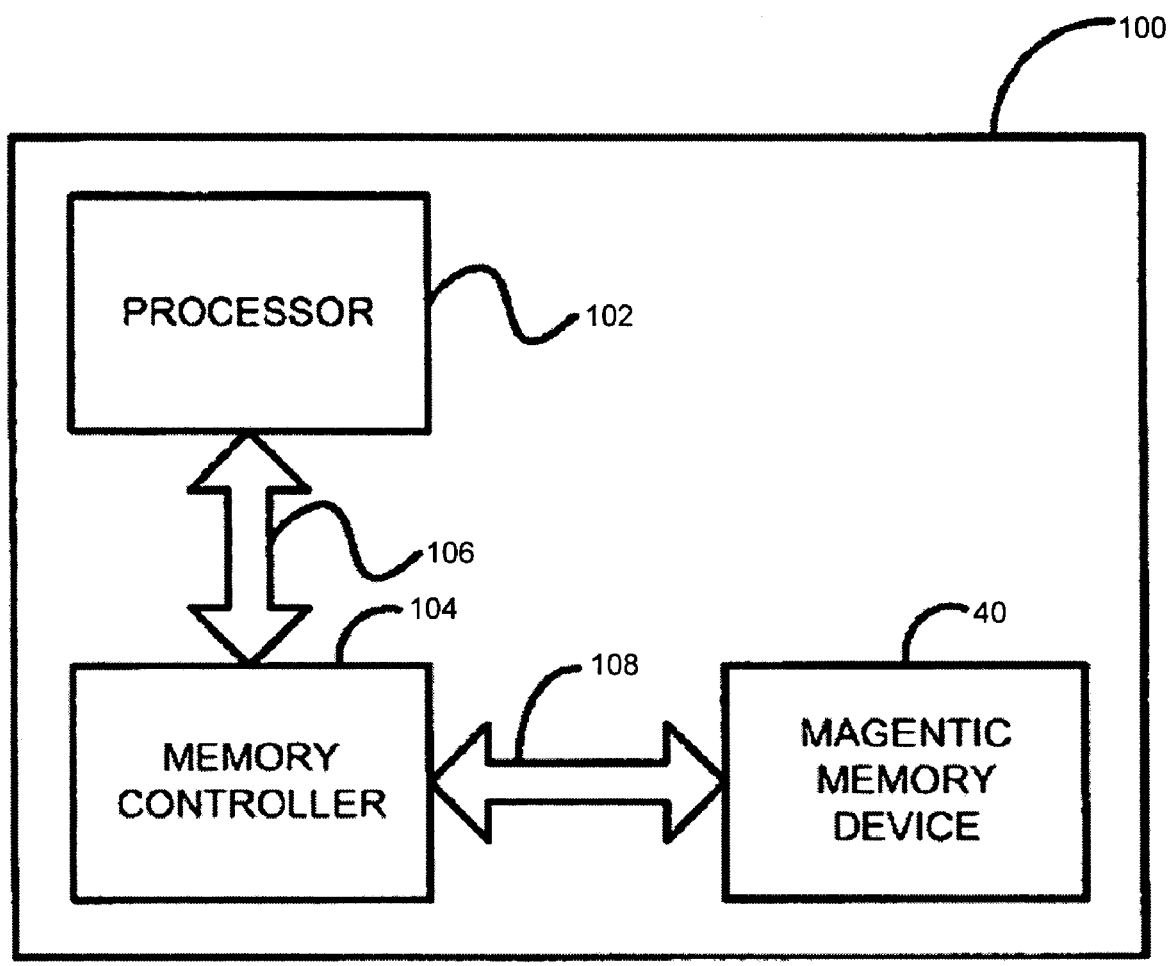

FIGS. 4(a)-(c) illustrate the state of the memory cell at various temperature levels according to various embodiments of the present invention;

FIG. 5 is a diagram of a MRAM system according to various embodiments of the present invention;

FIGS. 6(a)-(b) illustrate a scheme that utilizes the word lines to generate localized perpendicular magnetic fields according to various embodiments of the present invention;

FIGS. 7(a)-(d) illustrate different embodiments of the memory cell according to the present invention;

FIGS. 8(a)-(k) illustrate a process for fabricating the MRAM system according to various embodiments of the present invention; and FIG. 9 illustrates a computing device according to various embodiments of the present invention.

DESCRIPTION

Figure 1:
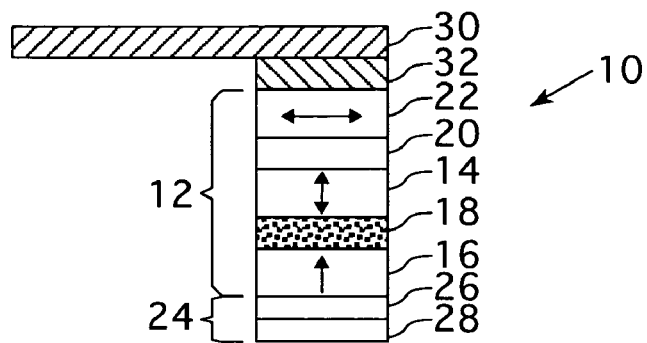
FIG. 1 is a diagram of a memory cell according to various embodiments of the present invention.

Various embodiments of the present invention are directed to MRAM system comprising an M×N crossbar array of MRAM cells. FIG. 1 is a diagram of a memory cell 10 according to various embodiments of the present invention. The memory cell 10 comprises a magnetic storage (or MRAM) element 12 and a two-junction diode 24. The diode 24, according to the embodiment shown in FIG. 1, comprises a p-doped layer 26 and an n+ doped layer 28, forming a p-n diode junction. The p-doped layer 26 may serve as the diode anode and the n+ dopes layer 28 may serve as the diode cathode. The p-doped layer 26 may comprise p-doped poly silicon and the n+ doped layer 28 may comprise n+ doped silicon.

The magnetic storage element 12 comprises a first magnetic layer (or "storage layer") 14 and a second magnetic layer (or "reference layer") 16, and a tunnel barrier layer 18 between the storage and reference layers 14, 16. The magnetic storage element 12 also comprises a phase transition interlayer 20 adjacent to the storage layer 14, and a magnetic assist layer 22 adjacent to the phase transition interlayer.

The magnetization of the reference layer 16 is fixed in the perpendicular direction with a relatively large perpendicular anisotropy field, as indicated by the vertical arrow in FIG. 1. The magnetic storage layer 14 preferably comprises small magnetic grains, each with a strong uniaxial magnetic anisotropy and a magnetic easy axis perpendicular to the film plane, such that the magnetization orientation of the storage layer 14 can be switched in the perpendicular direction, as indicated by the double-headed vertical arrow in FIG. 1, representing the two different memory states of the cell 10. The magnetocrystalline perpendicular anisotropy of the storage layer 14 only needs to be sufficient for memory state retention against thermal energy and other disturbing sources. The reference layer 16 comprises a magnetic material such as, for example, a multi-layer structure of Co/Pt, Co/Pd, or Co/Ni. The storage layer 14 may comprise a magnetic material such as, for example, Co alloys, FePt ($L1_0$), CoPt, FePd, AlMn, or other $L1_0$ materials. The thicknesses of the storage layer 14 and the reference layer 16 may be between five and 20 nm, respectively.

The tunnel barrier layer 18 may comprise a dielectric material, such as $AlO_x$, $MgO_x$, $TiO_x$, or any other suitable oxide or dielectric, and have a thickness of about 0.5 nm to five nm. The tunnel barrier layer 16, sandwiched between the two magnetic layers 14, 16, may act as a barrier layer of a magnetic tunnel junction (MJT).

The magnetic assist layer 22 preferably comprises small magnetic grains, each grain having a strong uniaxial magnetic anisotropy and a magnetic easy axis in the film plane (i.e., in the x-direction in the example) as indicated by the horizontal arrow in the magnetic assist layer 22 in FIG. 1. The magnetic assist layer 22 may comprise a magnetic material such as, for example, Co alloys, FePt ($L1_0$), CoPt, FePd, AlMn, or other $L1_0$ materials, and may have a thickness of between five and twenty nm. For example, the assist layer 22 may comprise CoIr, which is an hcp structure with a large negative K1 at room temperature if the Ir concentration is around 15% to 20%, the advantageousness of which will be apparent from the description to follow.

Figure 2:
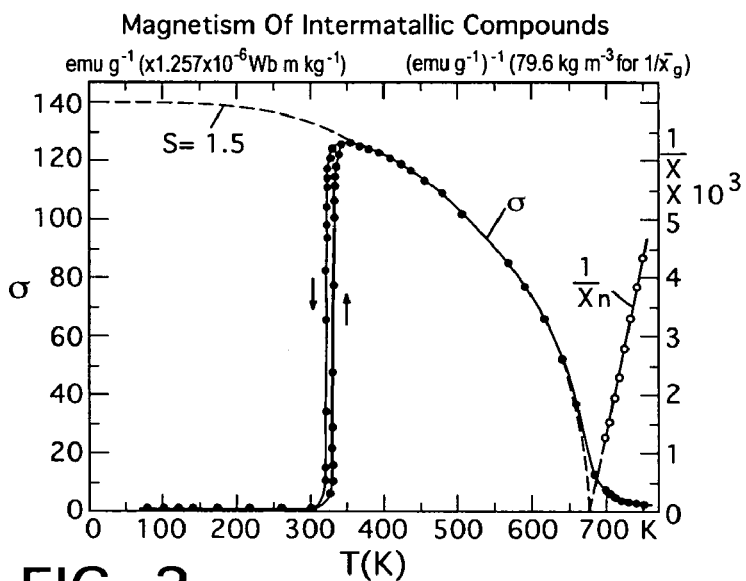
FIG. 2 is a plot of the magnetization curve as a function of temperature for FeRh.

The phase transition interlayer 20 is between the storage layer 14 and the assist layer 22. The phase transition interlayer 20 may comprise a material with small magnetic grains that switches from antiferromagnetic at ambient to ferromagnetic at or above a transition temperature ($T_{A-F}$) that is greater than ambient. One such material is FeRh (B2), which experiences a first order phase transformation at a transition temperature $T_{A-F}$ that can range from 300° K and 500° K, depending on the film texture and the underlayer used. This is much less than the Curie temperature for FeRh, which is in the range of 673° K to 950° K. Also, such heating (e.g., 300° K to 500° K) typically would have little effect on the perpendicular and in-plane magnetic layers 14, 16. As shown in FIG. 2, the phase below the transition temperature $T_{A-F}$ is antiferromagnetic while above the transition temperature the material becomes ferromagnetic. The sharp transition between antiferromagnetic phase and ferromagnetic phase, as shown in the example of FIG. 2, effectively enhances the spatial gradient and limits the size of the phase transformed spot. Recent experimental study has shown that the antiferromagnetic to ferromagnetic phase transformation occurs well within the deep sub-nanosecond regime. The phase transition interlayer 20 may have a thickness of between one nm and ten nm, for example.

Figure 3:
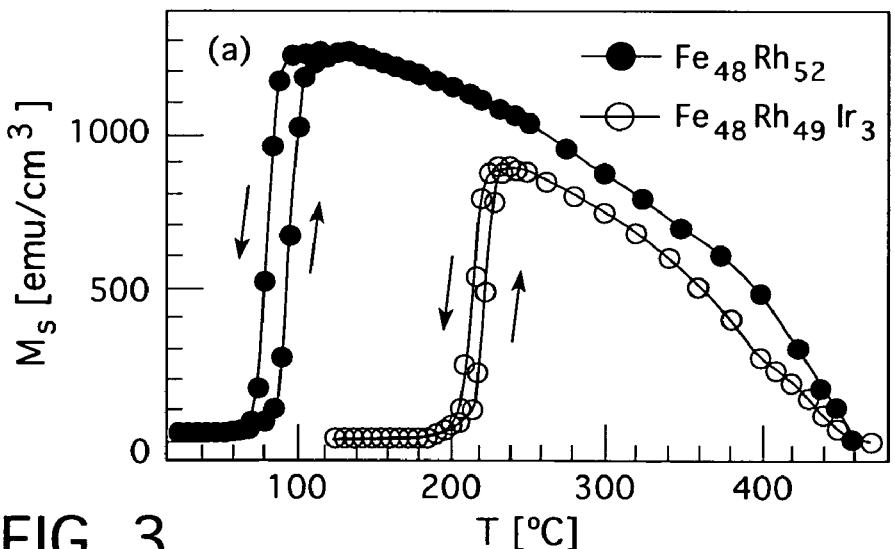
FIG. 3 is a chart showing the magnetization curves for FeRh and FeRhIr as a function of temperature.

In another embodiment, the phase transition interlayer 20 may comprise $Fe_x(Rd_{100-y}M_y)_{100-x}$, where M is selected from the group consisting of Ir, Pt, Ru, Re, and Os. In addition, y is preferably between zero and fifteen inclusive (i.e., $0 \leq y \leq 15$). Addition of the third element M may allow the transition temperature to be tuned (e.g., increased). FIG. 3 shows how the transition temperature can be increased by adding 3% Ir. Other possible materials for the phase transition interlayer 14 include MnZn, SmZn, GdZn, TbZn, DyZn, HoZn, and ErZn.

According to various embodiments, when the interlayer 20 is in antiferromagnetic phase (or non-magnetic phase), there exists little magnetic coupling between the two adjacent ferromagnetic layers 14, 22. When the interlayer 20 changes to ferromagnetic phase (i.e., when it is heated to or above the transition temperature $T_{A-F}$), the interlayer 20 couples the magnetic moments of the two adjacent layers 14, 22 ferromagnetically. The exchange coupling between the phase transition interlayer 20 and the in-plane magnetic assist layer 22 causes the in-plane magnetic assist layer 22 to exert an effective magnetic field that is significantly stronger (such as 100 times stronger) that fields that can be applied artificially (e.g., externally applied). As a result, if the anisotropy field-thickness product of the two layers 14, 22 is similar and the coupling is sufficiently strong, the effective magnetic anisotropy of the storage layer 14 and the assist layer 22 essentially vanishes. Hence, writing of the storage layer 14 can be achieved easily with a field that needs only to be a few percent of the ambient anisotropy field of the storage layer 14.

According to other embodiments, the two-terminal diode 24 may be a Schottky diode or a metal-insulator-metal diode, or any other suitable two-terminal diode device.

Figure 7A:
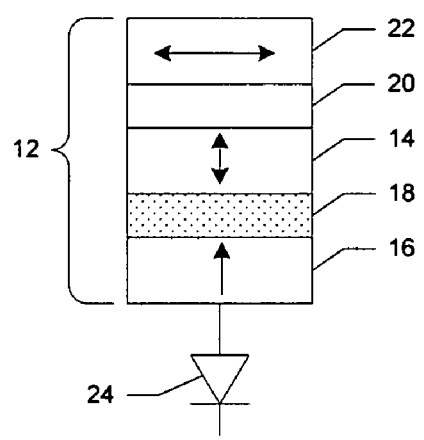

FIGS. 4(a)-(c) illustrate the magnetic orientation of the storage layer 14, the phase transition interlayer 20, and the assist layer 22 at various temperatures. FIG. 7(a) shows the magnetic orientation when the temperature of the interlayer 20 is below the transition temperature. In this temperature range, the interlayer 20 is antiferromagnetic and there is little coupling between the storage layer 14 and the assist layer 22. FIG. 4(b) shows the magnetic orientation after the interlayer 20 has been heated to or above the transition temperature $T_{A-F}$. The interlayer 20 may be heated, for example, by the heat radiated from a heater layer 32 (see FIG. 1) that radiates heat when conducting current. As shown in FIG. 4(b), when the temperature of the interlayer 20 is above the transition temperature $T_{A-F}$ (but below the Curie temperature), the interlayer 20 is ferromagnetic, resulting in ferromagnetic exchange coupling between the storage layer 14 and the assist layer 22, substantially reducing the switching field of the storage layer 14. As such, as shown in FIG. 4(c), a magnetic field H at conventional strength can cause the magnetization of the storage layer 14 to reverse its direction. The heat may then be removed and the interlayer 20 may cool to a temperature below the transition temperature $T_{A-F}$, with the magnetization of the storage layer 14 remaining in its reversed state. In this way, the memory cell can be used for recording binary data.

The exchange coupling strength for the interlayer 20 in the ferromagnetic phase can be tuned by changing the interlayer thickness as described in U.S. patent application Ser. No. 11/700,308, filed Jan. 31, 2007, which is incorporated herein by reference.

Returning to FIG. 1, the n+ layer 28 of the diode 24 may serve as a bit line for the memory cell 10. In addition, the memory cell 10 may comprise a conductive word line 30, perpendicular to the bit line 28, on the opposite end of the memory cell 10. According to various embodiments, as shown in FIG. 1, the heater layer 32 may be adjacent to the word line 30. When conducting current between the word line 30 and the bit line 28, the heater later 32 radiates heat to heat the phase transition interlayer 20 to cause the phase transition interlayer 20 to transition from antiferromagnetic to ferromagnetic. The heater layer 32 preferably comprises an electrically conductive material with a relatively high electrical resistance, such as tungsten.

According to various embodiments, an MRAM system 40, shown in FIG. 5, may comprise a crossbar array of such memory cells 10. The MRAM system 40 may comprise M word lines 30 and N bit lines 28, with M×N memory cells 10. The diode 24 associated with each memory cell 10 is used to address the memory cells 10 individually.

The magnetic field used to switch the memory state of the storage layer 14 can be generated globally or generated by running a small current at the word lines 30, as shown in FIGS. 6(a)-(b). The heating current requires no directionality and is, therefore, suited for the diode-enabled write addressing in the crossbar architecture. Since the AF-F transition temperature of the phase transition interlayer 20 can be made relatively low through selection of the material and thickness of the phase transition interlayer 20, natural heating from the heating layer 32 should be sufficient to cause the phase transition interlayer 20 to transition from AF to F. The magnetic tunnel junction is the high impedance portion of the memory cell 10 and bears most of the voltage drop besides that of the diode 24. The ballistic tunneling electrons quickly diffuse in the arriving electrode (either the storage layer 14 or the reference layer 16, depending on the direction of the current flow), thereby dissipating heat. Therefore, the direction of the current, i.e., the direction of the tunneling electrons, should strongly affect the heating of the phase transition interlayer 20. It should be noted that the switching of the magnetoresistive tunneling junction is not accomplished via bipolar spin torque in such an embodiment, but rather by the assistance of the thermally induced transition of the phase transition interlayer 20.

Figure 7B:
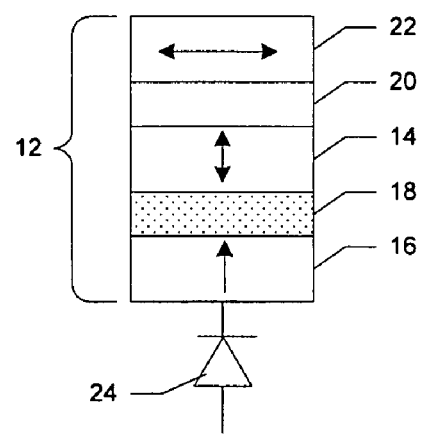
Figure 7C:
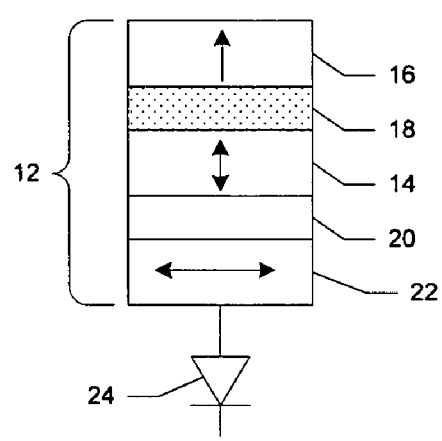
Figure 7D:
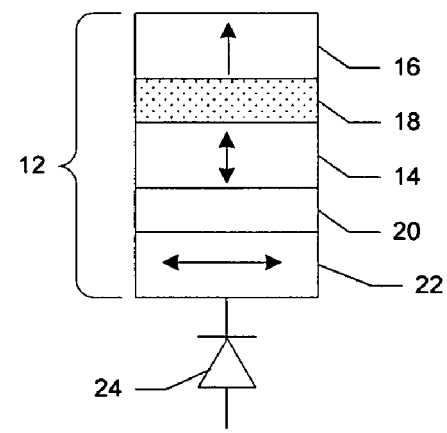

In the embodiment of the memory cell 10 shown in FIG. 1, the anode of the diode 24 is immediately adjacent to the reference layer 16, as shown in FIG. 7(a). According to other embodiments as shown in FIGS. 7(b)-(d), other structures for the memory cell 10 could be used. FIG. 7(b) shows an embodiment where the diode cathode is adjacent to the reference layer 16. FIG. 7(c) shows an embodiment where the diode anode is adjacent to the assist layer 22. FIG. 7(d) shows an embodiment where the diode cathode is adjacent to the assist layer 22. Preferably, all of the memory cells 10 of the array 24 have the same structure.

FIGS. 8(a) through 8(k) illustrate a process for fabricating the MRAM array 40 according to various embodiments. First, as shown in FIG. 8(a), the silicon layer 50 of a silicon-on-insulator (SOI) wafer, acting as the substrate, is degenerately doped and annealed as an n+ material 52, which will be used to form the bit lines 28 in subsequent steps. Next, a p-type polysilicon layer 54 is deposited using, for example, low-pressure chemical vapor deposition (LPCVD).

Next, as shown in FIG. 8(b), the following layers can be deposited sequentially: the magnetic reference layer 56; a dielectric layer 58 to form the tunnel barrier; the magnetic storage layer 60; the phase transition interlayer (e.g., FeRh) 62; the magnetic assist layer 64; and the heating material layer 66. The layers 56-66 may be deposited using, for example, ion sputtering deposition techniques, although any other suitable deposition techniques could be used.

Next, as shown in FIG. 8(c), a first lithography mask 68 is applied to pattern the memory cells 10. The mask 68 can be prepared with optical, electronbeam, or nanoimprint lithography techniques. Next, as shown in FIG. 8(d), ion milling and reactive ion etching (RIE) can be used to created isolated multilayered lines 70. Next, as shown in FIG. 8(e), a low-k dielectric 72 may be deposited between the isolated multilayered lines 70 and planarized using CMP (chemical-mechanical-planarization), removing the mask 68.

Next, as shown in FIGS. 8(f) and 8(g), a second lithography step can be used to pattern the word lines 30, which are orthogonal to the bit lines 28, using a second mask 76. FIG. 8(f) is a front view of the structure, showing the N bit lines 28, and FIG. 8(g) is a side view showing the M word lines 30.

Next, as shown in FIGS. 8(h) and 8(i), a combination of ion milling and RIE can be utilized, using the mask 76, to create the individual memory cells 10, connected by respective word lines 30 and bit lines 28. Finally, as shown in FIGS. 8(j) and 8(k), a low-k dielectric can be deposited between the memory cells, and the entire structure can be planarized using CMP, removing the mask 76 in the process. A top insulating layer (not shown) may be formed on the word lines and the memory cells, etc.

The MRAM system 40, according to various embodiments, combines major advantages of several popular memory technologies. First, like flash memory, it is truly non-volatile. Second, the memory cells 10 have higher speeds than flash memory. In fact, the memory cells 10 can be made even faster than DRAM, and close to SRAM. Third, unlike phase-change memory (PRAM), which has lifetime issues, the MRAM cells 10 has basically unlimited write-erase life cycles. Forth, the crossbar circuit approach offers extremely high device density, much higher than the emerging ZRAM (1T DRAM). Finally, because an MRAM cell can retain its memory without the need of refreshing, the MRAM system 40 should consume less power than volatile memories.

FIG. 9 is a diagram of a computing device 100 according to various embodiments of the present invention. The computing device 100 includes a processor 102 in communication with a memory controller 104 through a bus 106. The memory controller 104 is in communication with the memory system 40 described above a bus 108. The computing device 100 may be, for example, a personal computer (PC), a workstation, a laptop computer, a server, a supercomputer, a personal digital assistant (PDA), a pocket-PC, or any other device comprising a memory and a processor.

In accordance with other embodiments, the MRAM system 40 could be incorporated onto a chip or substrate with other circuitry, such as part of a system-on-chip (SOC) application or other type of integrated circuit. For example, the MRAM system 40 could be fabricated on a semiconductor substrate on which other circuitry, such as a processor, etc., is also fabricated. For example, in a SOC having a number of memory units, at least one of the memory units could be a MRAM system 40 as described above.

While several embodiments of the invention have been described, it should be apparent, however, that various modifications, alterations and adaptations to those embodiments may occur to persons skilled in the art with the attainment of some or all of the advantages of the present invention. For example, some of the various materials described above are exemplary, and other materials could be used in certain instances. It is therefore intended to cover all such modifications, alterations, and adaptations without departing from the scope and spirit of the present invention as defined by the appended claims.

What is claimed is:

1. A memory cell comprising:
   a 2-terminal diode; and
   a magnetic storage element adjacent to the diode, wherein the magnetic storage element comprises:
      a perpendicular anisotropy magnetic reference layer;
      a perpendicular anisotropy magnetic storage layer;
      a tunnel junction between the reference layer and the storage layer;
      an in-plane magnetic assist layer; and
      a phase transition interlayer between the storage layer and the assist layer, wherein the phase transition interlayer comprises a material that switches from antiferromagnetic to ferromagnetic at a transition temperature that is greater than ambient.

2. The memory cell of claim 1, wherein the diode comprises a semiconductor p-n junction diode.

3. The memory cell of claim 1, wherein the diode comprises a Schottky diode.

4. The memory cell of claim 1, wherein the diode comprises a metal-insulator-metal diode.

5. The memory cell of claim 1, wherein the phase transition interlayer comprises FeRh.

6. The memory cell of claim 1, wherein the transition temperature is between 300° K and 500° K.

7. The memory cell of claim 1, wherein the diode comprises an n-type layer and a p-type layer, wherein the magnetic reference layer is adjacent the p-type layer.

8. The memory cell of claim 1, wherein the diode comprises an n-type layer and a p-type layer, wherein the magnetic reference layer is adjacent the n-type layer.

9. The memory cell of claim 1, wherein the diode comprises an n-type layer and a p-type layer, wherein the magnetic assist layer is adjacent the p-type layer.

10. The memory cell of claim 1, wherein the diode comprises an n-type layer and a p-type layer, wherein the magnetic assist layer is adjacent the n-type layer.

11. The memory cell of claim 1, wherein the magnetic assist layer comprise CoIr.

12. The memory cell of claim 1, further comprising a heater layer adjacent to the magnetic storage element.

13. The memory cell of claim 12, wherein the heater layer is adjacent to the assist layer.

14. An MRAM system comprising:
N word lines;
M bit lines orthogonal to the word lines; and
M×N MRAM cells, one of the M×N MRAM being located between each intersection of one of the N word lines and one of the M bit lines, wherein each memory cell comprises:
a 2-terminal diode; and
a magnetic storage element adjacent to the diode, wherein the magnetic storage element comprises:
a perpendicular anisotropy magnetic reference layer;
a perpendicular anisotropy magnetic storage layer;
a tunnel junction between the reference layer and the storage layer;
an in-plane magnetic assist layer; and
a phase transition interlayer between the storage layer and the assist layer, wherein the phase transition interlayer comprises a material that switches from antiferromagnetic to ferromagnetic at a transition temperature that is greater than ambient.

15. The MRAM system of claim 14, wherein the phase transition interlayer comprises FeRh.

16. The MRAM system of claim 14, wherein the transition temperature is between 300° K and 500° K.

17. The MRAM system of claim 14, wherein the diode comprises an n-type layer and a p-type layer, wherein the magnetic reference layer is adjacent the p-type layer.

18. The MRAM system of claim 14, wherein the diode comprises an n-type layer and a p-type layer, wherein the magnetic reference layer is adjacent the n-type layer.

19. The MRAM system of claim 14, wherein the diode comprises an n-type layer and a p-type layer, wherein the magnetic assist layer is adjacent the p-type layer.

20. The MRAM system of claim 14, wherein the diode comprises an n-type layer and a p-type layer, wherein the magnetic assist layer is adjacent the n-type layer.

21. The MRAM system of claim 14, wherein the magnetic assist layer comprise CoIr.

22. The MRAM system of claim 14, wherein each memory cell comprises a heater layer adjacent to the magnetic storage element.

23. The MRAM system of claim 22, wherein the heater layer is adjacent to the assist layer.

24. The MRAM system of claim 14, wherein the diode comprises a diode selected from the group consisting of a semiconductor p-n junction diode, a Schottky diode, and a metal-insulator-metal diode.

25. A computing device comprising:
a processor; and
a memory controller in communication with the processor; and
a MRAM system in communication with the memory controller, wherein the MRAM system comprises:
N word lines;
M bit lines orthogonal to the word lines; and
M×N MRAM cells, one of the M×N MRAM being located between each intersection of one of the N word lines and one of the M bit lines, wherein each memory cell comprises:
a 2-terminal diode; and
a magnetic storage element adjacent to the diode, wherein the magnetic storage element comprises:
a perpendicular anisotropy magnetic reference layer;
a perpendicular anisotropy magnetic storage layer;
a tunnel junction between the reference layer and the storage layer;
an in-plane magnetic assist layer; and
a phase transition interlayer between the storage layer and the assist layer, wherein the phase transition interlayer comprises a material that switches from antiferromagnetic to ferromagnetic at a transition temperature that is greater than ambient.

26. A method of fabricating a magnetic memory device, comprising:
sequentially depositing a plurality of thin films on a substrate and patterning the deposited thin films to form:
a plurality of bit lines;
a plurality of magnetic memory cells on each bit line, wherein the magnetic memory cells comprise:
a 2-terminal diode; and
a magnetic storage element adjacent to the diode, wherein the magnetic storage element comprises:
a perpendicular anisotropy magnetic reference layer;
a perpendicular anisotropy magnetic storage layer;
a tunnel junction between the reference layer and the storage layer;
an in-plane magnetic assist layer; and
a phase transition interlayer between the storage layer and the assist layer, wherein the phase transition interlayer comprises a material that switches from antiferromagnetic to ferromagnetic at a transition temperature that is greater than ambient; and
a plurality of word lines, orthogonal to the bit lines, wherein each word line is connected to a subset of the magnetic memory cells, such that each magnetic memory cell is between one bit line and one word line.

27. The method of claim 26, wherein the substrate comprises a silicon-on-insulator wafer.

28. The method of claim 26, wherein the diode comprises a diode selected from the group consisting of a semiconductor p-n junction diode, a Schottky diode, and a metal-insulator-metal diode.

29. The method of claim 26, wherein the phase transition interlayer comprises FeRh.

30. The method of claim 26, wherein the transition temperature is between 300° K and 500° K.

31. The method of claim 26, wherein the diode comprises a p-type layer adjacent to an n-type layer.

32. The method of claim 31, wherein the magnetic reference layer is adjacent the p-type layer.

33. The method of claim 31, wherein the magnetic reference layer is adjacent the n-type layer.

34. The method of claim 31, wherein the magnetic assist layer is adjacent the p-type layer.

35. The method of claim 31, wherein the magnetic assist layer is adjacent the n-type layer.

36. The method of claim 31, wherein the magnetic assist layer comprise CoIr.

37. The method of claim 26, wherein patterning the deposited thin films comprises at least two separate lithographic etching steps.

38. An integrated circuit, comprising:
an MRAM system, wherein the MRAM system comprises:
N word lines;
M bit lines orthogonal to the word lines; and
M×N MRAM cells, one of the M×N MRAM being located between each intersection of one of the N word lines and one of the M bit lines, wherein each memory cell comprises:
a 2-terminal, diode; and
a magnetic storage element adjacent to the diode, wherein the magnetic storage element comprises:
a perpendicular anisotropy magnetic reference layer;
a perpendicular anisotropy magnetic storage layer;
a tunnel junction between the reference layer and the storage layer;
an in-plane magnetic assist layer; and
a phase transition interlayer between the storage layer and the assist layer, wherein the phase transition interlayer comprises a material that switches from antiferromagnetic to ferromagnetic at a transition temperature that is greater than ambient.

* * * * *